U S008492777B2

(12) United States Patent
Hsieh et al.

(10) Patent No.: US 8,492,777 B2
(45) Date of Patent: Jul. 23, 2013

(54) LIGHT EMITTING DIODE PACKAGE, LIGHTING DEVICE AND LIGHT EMITTING DIODE PACKAGE SUBSTRATE

(75) Inventors: Chung-Chuan Hsieh, New Taipei (TW); Yi-Chun Chen, New Taipei (TW); Yi-Ting Chiu, New Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 222 days.

(21) Appl. No.: 13/078,933

(22) Filed: Apr. 2, 2011

(65) Prior Publication Data

US 2011/0248289 A1    Oct. 13, 2011

Related U.S. Application Data

(60) Provisional application No. 61/322,309, filed on Apr. 9, 2010.

(51) Int. Cl.
*H01L 33/00* (2010.01)

(52) U.S. Cl.
USPC .. 257/88; 257/91; 257/E33.056; 257/E33.066

(58) Field of Classification Search
USPC .................. 257/88, 91, E33.056, E33.066
See application file for complete search history.

(56) References Cited

U.S. PATENT DOCUMENTS

| 5,722,760 | A | 3/1998 | Chien |
| 6,061,160 | A | 5/2000 | Maruyama |
| 6,770,498 | B2 | 8/2004 | Hsu |
| 6,949,772 | B2 | 9/2005 | Shimizu et al. |
| 7,211,835 | B2 | 5/2007 | Ono |
| D598,871 | S | 8/2009 | Eberle et al. |
| D615,504 | S | 5/2010 | Keller et al. |
| 8,338,836 | B2 * | 12/2012 | Lee et al. ................. 257/88 |
| 2004/0201987 | A1 | 10/2004 | Omata |
| 2007/0205419 | A1 | 9/2007 | Ono et al. |
| 2008/0054286 | A1 | 3/2008 | Loh et al. |
| 2008/0149945 | A1 | 6/2008 | Nagai |

FOREIGN PATENT DOCUMENTS

| CN | 1605790 | 4/2005 |
| CN | 300935517 | 6/2009 |
| CN | 300942206 | 6/2009 |
| CN | 101487579 | 7/2009 |
| CN | 300951410 | 7/2009 |
| CN | 300951411 | 7/2009 |
| CN | 300951412 | 7/2009 |
| CN | 101614333 | 12/2009 |

(Continued)

*Primary Examiner* — Tu-Tu Ho
(74) *Attorney, Agent, or Firm* — Jianq Chyun IP Office

(57) ABSTRACT

A light emitting diode (LED) package includes a LED package substrate, first LED chips and second LED chips. The LED package substrate includes a substrate, a first bonding pad, second bonding pads and a third bonding pad. The first, second and third bonding pads are disposed on the substrate. The second bonding pads are arranged in an array. The first and third bonding pads are located adjacent respectively to first and last column of the array. The first LED chips are die-bonded on the first bonding pad and wire-bonded respectively to the second bonding pads arranged in first column of the array. The second LED chips are die-bonded on the second bonding pads respectively. In each row except last column, each second LED chip is wire-bonded to the second bonding pad arranged in next column. The second LED chips located in last column are wire-bonded to the third bonding pad.

19 Claims, 7 Drawing Sheets

FOREIGN PATENT DOCUMENTS

| | | |
|---|---|---|
| CN | 201407528 | 2/2010 |
| DE | 402008001869 | 7/2008 |
| JP | 1363307 | 6/2009 |
| JP | 1363680 | 6/2009 |
| KR | 10-0809210 | 1/2008 |
| KR | 10-0941412 | 2/2010 |
| TW | 555156 | 9/2003 |
| TW | M351303 | 2/2009 |
| TW | I312586 | 7/2009 |
| TW | M366763 | 10/2009 |
| TW | M379724 | 5/2010 |

\* cited by examiner

LIGHT EMITTING DIODE PACKAGE, LIGHTING DEVICE AND LIGHT EMITTING DIODE PACKAGE SUBSTRATE

CROSS-REFERENCE TO RELATED APPLICATION

This application claims the priority benefit of U.S. Provisional Application Ser. No. 61/322,309, filed Apr. 9, 2010. The entirety of the above-mentioned patent application is hereby incorporated by reference herein and made a part of this specification.

BACKGROUND OF THE INVENTION

1. Field of the Invention

The present invention generally relates to a light emitting diode (LED) package, a LED package substrate thereof and a lighting device having the same. More particularly, the present invention relates to a light emitting diode (LED) package having a plurality of bonding pads, a LED package substrate thereof and a lighting device having the same.

2. Description of Related Art

Light emitting diodes (LEDs) are semiconductor devices. LED chips are mainly fabricated using compounds of group III-V elements, for example, gallium phosphide (GaP) or gallium arsenide (GaAs). Moreover, LEDs emit light by converting electric energy into light energy. In details, LEDs apply currents to compound semiconductors so as to release excess energy in the form of light through the binding of electrons and holes. Since the light emitting phenomenon of LEDs does not occur through thermo-luminescence or discharge-luminescence, the lifespan of LEDs can be longer than one hundred thousand hours. LEDs further include advantages such as fast response speed, small volume, energy saving, low pollution, high reliability, suitable for mass production, and so on. Thus, LEDs can be widely applied in various fields, for instance, large display boards, traffic lights, cellular phones, scanner, light sources of fax machines, LED lamps, and the like.

A conventional LED package 50 having a plurality of vertical type LED chips 52 is shown in FIG. 1. In a vertical type LED chip, two electrodes are located respectively on upper side and bottom side of the chip, so the chips 52 die-bonded on a bonding pad 54 are unable to be connected in series and have to be respectively wire-bonded to a bonding pad 56 for being connected in parallel, such that larger driving voltage is needed. In addition, under the arrangement as shown in FIG. 1, a bonding wire 58 connected to one chip 52 may cross over another chip 52, such that lighting efficiency of LED package 50 is reduced, and the bonding wire 58 having longer length is probably to be cracked and collapsed.

SUMMARY OF THE INVENTION

The present invention is to provide a light emitting diode (LED) package, having better reliability and optical quality.

The present invention is to provide a lighting device, where a LED package thereof has better reliability and optical quality.

The present invention is to provide a LED package substrate, where a LED package having the same has better reliability and optical quality.

As embodied and broadly described herein, the present invention provides a LED package, including a LED package substrate, a plurality of first LED chips, a plurality of second LED chips and a plurality of bonding wires. The LED package substrate includes a substrate, a first bonding pad, a plurality of second bonding pads and a third bonding pad. The first bonding pad is disposed on the substrate. The second bonding pads are disposed on the substrate and arranged in an n×(n−1) array, wherein n is a positive integer, and the first bonding pad is located adjacent to the second bonding pads arranged in column 1 of the array. The third bonding pad is disposed on the substrate and located adjacent to the second bonding pads arranged in column n−1 of the array. The second bonding pads are disposed between the first bonding pad and the third bonding pad. The first LED chips are die-bonded on the first bonding pad and aligned respectively to the second bonding pads arranged in column 1 of the array. The second LED chips are die-bonded on the second bonding pads respectively. Each of the first LED chips is wire-bonded to the corresponding second bonding pad arranged in column 1 of the array through one of the bonding wires. Each of the second LED chips die-bonded on the second bonding pads arranged in column n−1 of the array is wire-bonded to the third bonding pad through one of the bonding wires. The second LED chip die-bonded on the second bonding pad arranged in column i and row j of the array is wire-bonded to the second bonding pad arranged in column i+1 and row j of the array through one of the bonding wires, wherein $1 \leq i \leq n-2$ and $1 \leq j \leq n$.

As embodied and broadly described herein, the present invention provides a lighting device, including a base and a LED package. The LED package includes a LED package substrate, a plurality of first LED chips, a plurality of second LED chips and a plurality of bonding wires. The LED package substrate includes a substrate disposed on the base, a first bonding pad, a plurality of second bonding pads and a third bonding pad. The first bonding pad is disposed on the substrate. The second bonding pads are disposed on the substrate and arranged in an n×(n−1) array, wherein n is a positive integer, and the first bonding pad is located adjacent to the second bonding pads arranged in column 1 of the array. The third bonding pad is disposed on the substrate and located adjacent to the second bonding pads arranged in column n−1 of the array. The second bonding pads are disposed between the first bonding pad and the third bonding pad. The first LED chips are die-bonded on the first bonding pad and aligned respectively to the second bonding pads arranged in column 1 of the array. The second LED chips are die-bonded on the second bonding pads respectively. Each of the first LED chips is wire-bonded to the corresponding second bonding pad arranged in column 1 of the array through one of the bonding wires. Each of the second LED chips die-bonded on the second bonding pads arranged in column n−1 of the array is wire-bonded to the third bonding pad through one of the bonding wires. The second LED chip die-bonded on the second bonding pad arranged in column i and row j of the array is wire-bonded to the second bonding pad arranged in column i+1 and row j of the array through one of the bonding wires, wherein $1 \leq i \leq n-2$ and $1 \leq j \leq n$.

As embodied and broadly described herein, the present invention provides a LED package substrate, including a substrate, a first bonding pad, a plurality of second bonding pads and a third bonding pad. The first bonding pad is disposed on the substrate. The second bonding pads are disposed on the substrate and arranged in an n×(n−1) array, wherein n is a positive integer, and the first bonding pad is located adjacent to the second bonding pads arranged in column 1 of the array. The third bonding pad is disposed on the substrate and located adjacent to the second bonding pads arranged in column n−1 of the array. The second bonding pads are disposed between the first bonding pad and the third bonding pad.

According to an embodiment of the present invention, each of the second bonding pads arranged in row 2 to row n−1 of the array has a die-bonded portion for the corresponding second LED chip, a wire-bonded portion for the corresponding bonding wire, and a recess between the die-bonded portion and the wire-bonded portion, wherein the wire-bonded portion of the second bonding pad arranged in column i+1 and row j of the array is located between the die-bonded portion of the second bonding pad arranged in column i+1 and row j of the array and the die-bonded portion of the second bonding pad arranged in column i and row j of the array.

According to an embodiment of the present invention, each of the second bonding pads arranged in row 1 of the array has a die-bonded portion for the corresponding second LED chip, a wire-bonded portion for the corresponding bonding wire, and a recess between the die-bonded portion and the wire-bonded portion, wherein the die-bonded portions are located between the wire-bonded portions and the second bonding pads arranged in row 2 of the array.

According to an embodiment of the present invention, each of the second bonding pads arranged in row n of the array has a die-bonded portion for the corresponding second LED chip, a wire-bonded portion for the corresponding bonding wire, and a recess between the die-bonded portion and the wire-bonded portion, wherein the die-bonded portions are located between the wire-bonded portions and the second bonding pads arranged in row n−1 of the array.

According to an embodiment of the present invention, the LED package further includes a lens covering the first LED chips and the second LED chips, wherein n is an odd number, and an optical axis of the second LED chip die-bonded on the second bonding pad arranged in column (n−1)/2 and row (n+1)/2 of the array is aligned to an optical axis of the lens.

According to an embodiment of the present invention, a material of the substrate is ceramics. The LED package further comprises a phosphor layer covering the first LED chips and the second LED chips. The phosphor layer include a yellow phosphor, a red phosphor, a green phosphor or the any combination thereof.

According to an embodiment of the present invention, the substrate includes a first surface and a second surface opposite to the first surface. The first bonding pad, the second bonding pads and the third bonding pad are disposed on the first surface of the substrate. The LED package further includes a heat conduction pad, a first electrode and a second electrode. The heat conduction pad is disposed on the second surface and contacts the base. The first electrode is disposed on the second surface and electrically connected to the first bonding pad. The second electrode is disposed on the second surface and electrically connected to the third bonding pad.

According to an embodiment of the present invention, the first and second LED chips includes white light LED chips, blue light LED chips, red light LED chips, green light LED chips, or any combination thereof.

In summary, the LED package of the present invention has a plurality of second bonding pads arranged in an array and located between the first and third bonding pad. Even if the first and second LED chips are vertical type, the second LED chips arranged in the same row of the array and the corresponding first LED chip are able to be connected in series through the bonding wires, such that the driving voltage for the LED package is lowered. In addition, the length of the bonding wires is able to be shortened to prevent the bonding wires from being cracked and collapsed and crossing over the LED chips, such that reliability and optical quality of the LED package is promoting.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE INVENTION

Figure 1:
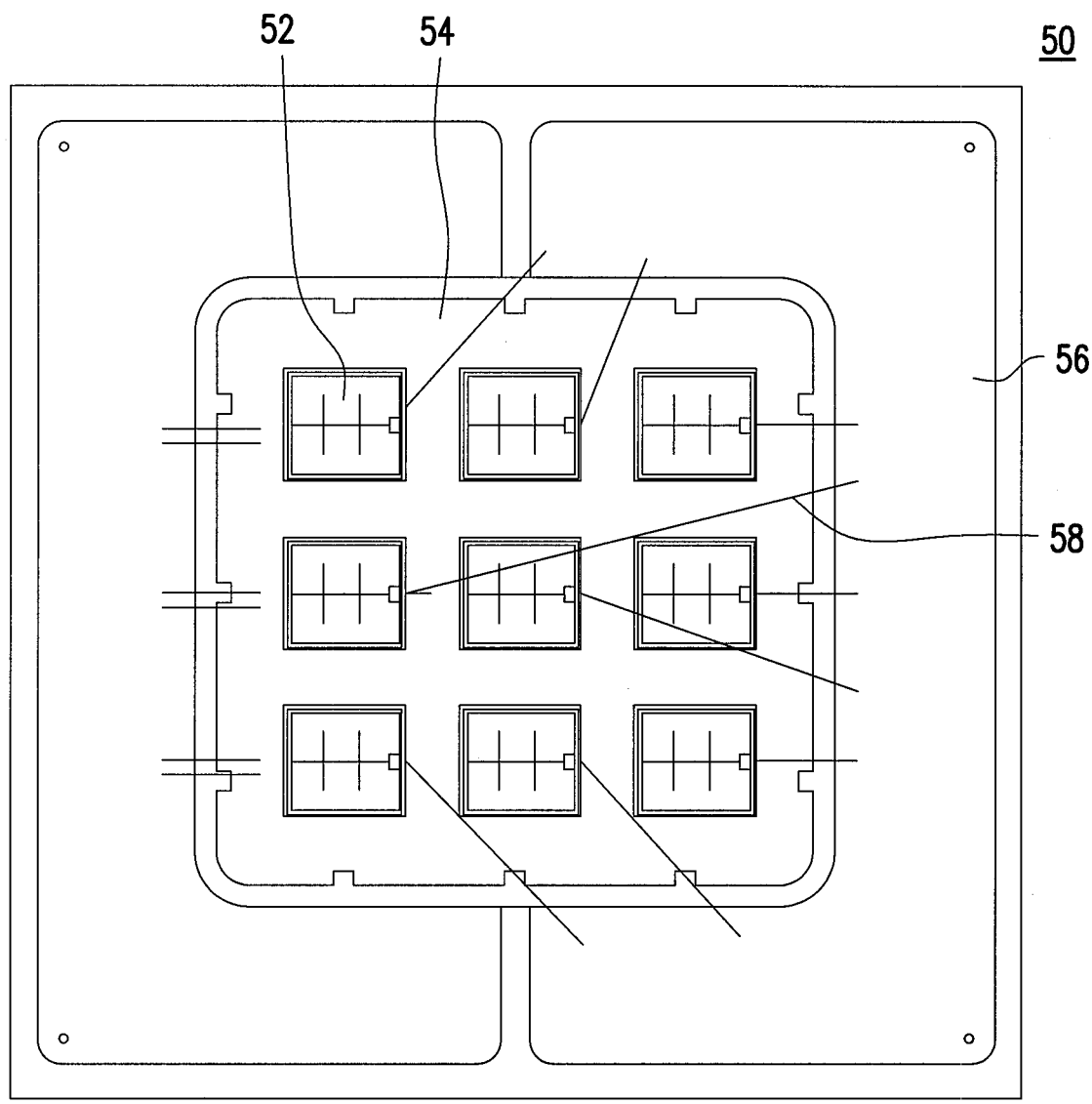
FIG. 1 is a top view of a conventional light emitting diode package.

Reference will now be made in detail to the present embodiments of the invention, examples of which are illustrated in the accompanying drawings. Wherever possible, the same reference numbers are used in the drawings and the description to refer to the same or like parts.

Figure 2:
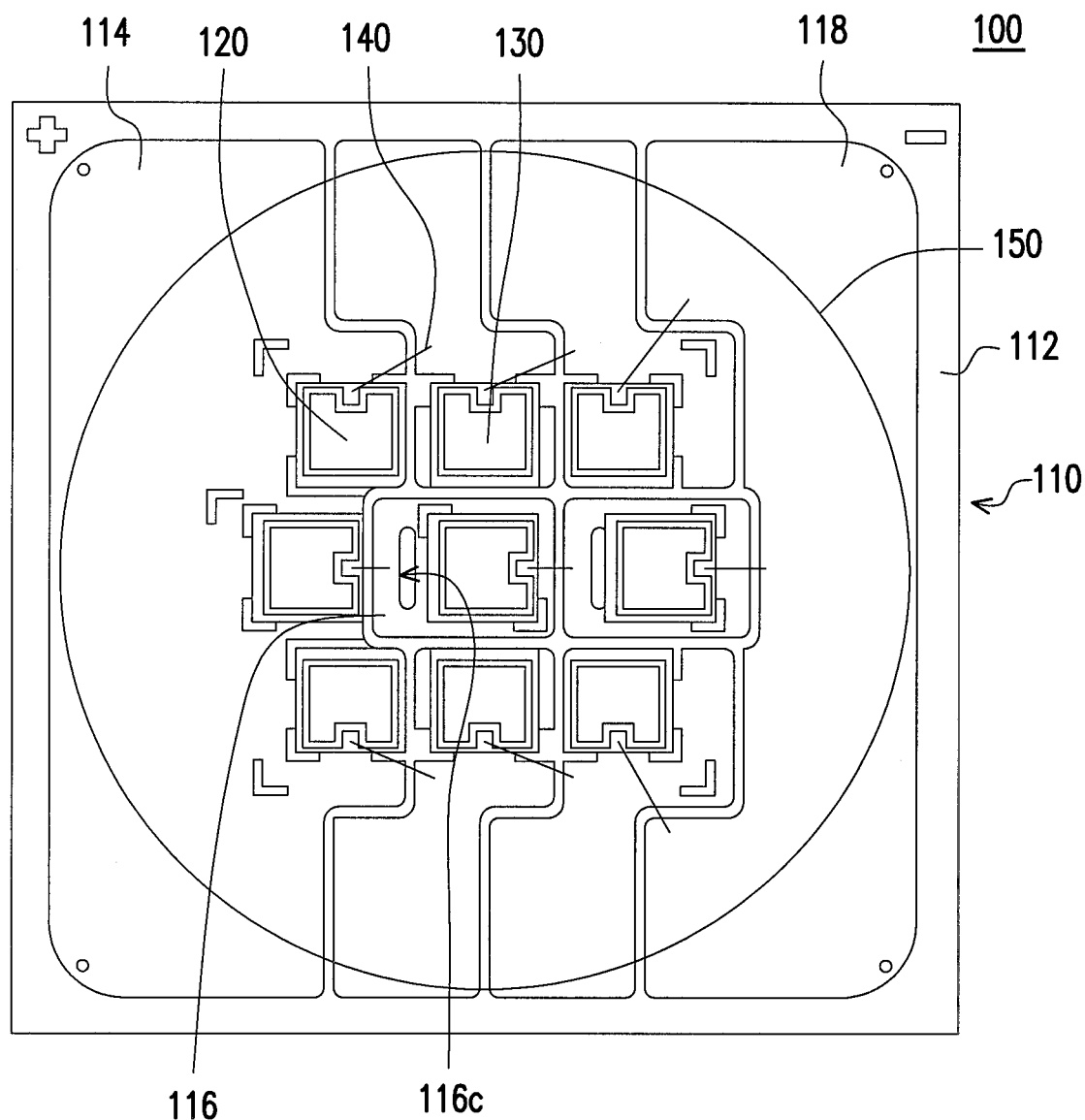
FIG. 2 is a top view of a light emitting diode package according to an embodiment of the present invention.
Figure 3:
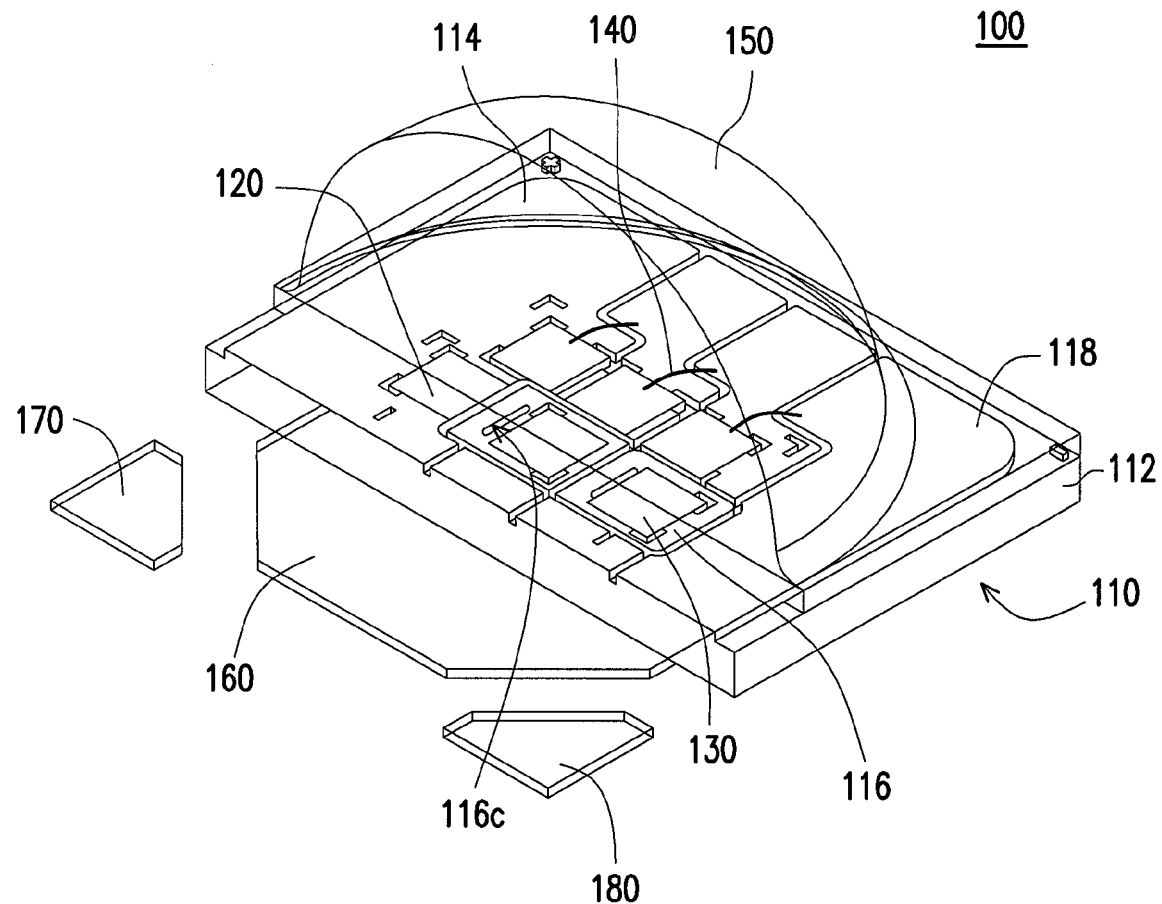
FIG. 3 is a three-dimensional view partially showing the light emitting diode package in FIG. 2.
Figure 4:
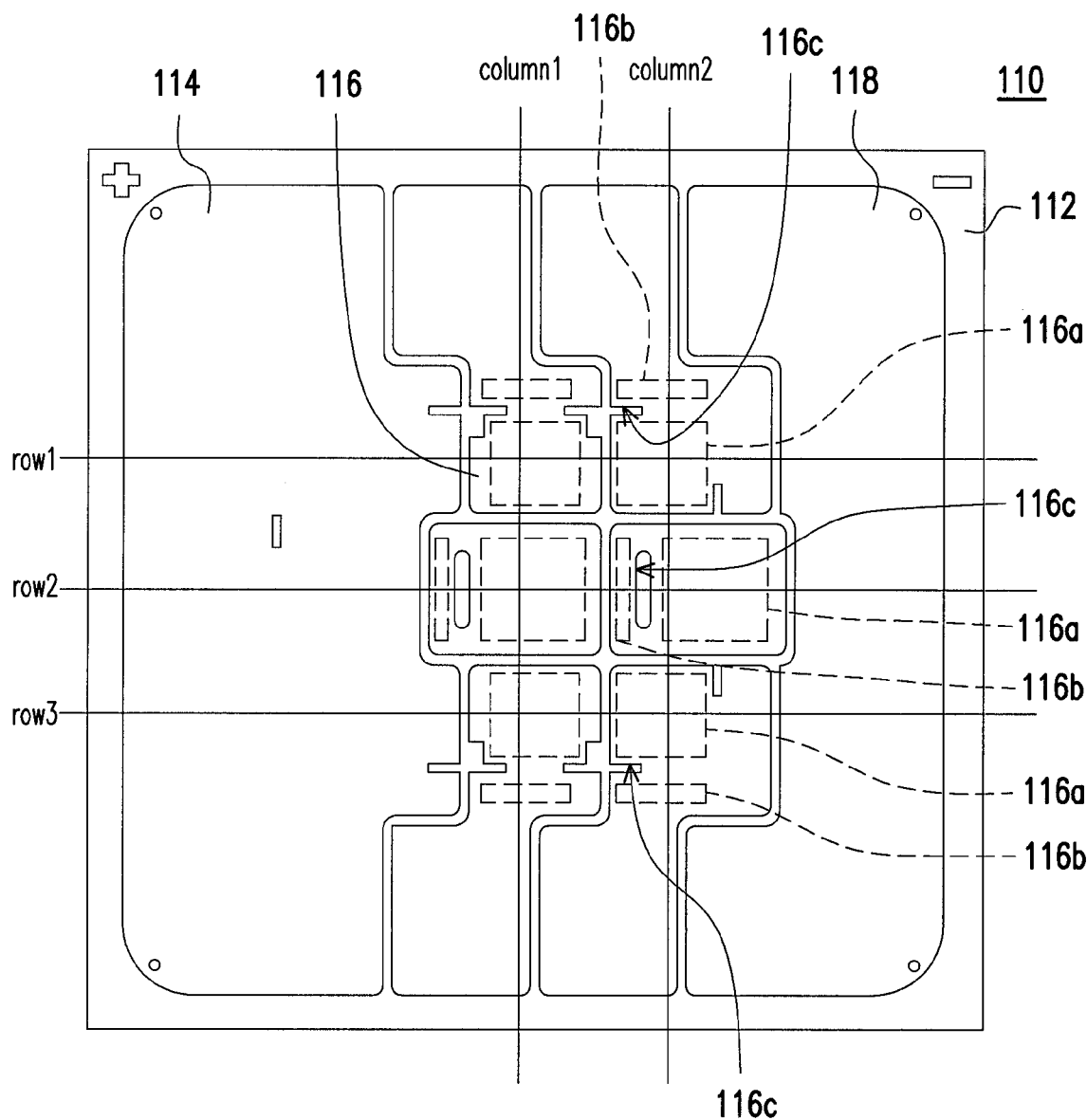
FIG. 4 is a top view of the light emitting diode package substrate of FIG. 2.

FIG. 2 is a top view of a light emitting diode package according to an embodiment of the present invention. FIG. 3 is a three-dimensional view partially showing the light emitting diode package in FIG. 2. FIG. 4 is a top view of the light emitting diode package substrate of FIG. 2. Referring to FIG. 2 to FIG. 4, the light emitting diode (LED) package 100 of the embodiment includes a LED package substrate 110, a plurality of first LED chips 120 (showing three), a plurality of second LED chips 130 (showing six) and a plurality of bonding wires 140 (showing nine). The LED package substrate 110 includes a substrate 112, a first bonding pad 114, a plurality of second bonding pads 116 (showing 6) and a third bonding pad 118. In one embodiment, the substrate 112 includes a top surface, and the first bonding pad 114 is disposed on a left side region of the top surface of the substrate 112. The third bonding pad 118 is disposed on a right side region of the top surface of the substrate 112. The second bonding pads 116 are disposed on a middle region of the top surface of the substrate 112. The second bonding pads 116 are disposed between the first bonding pad 114 and the second bonding pad 118. In another embodiment, the bonding pads may be electrically conductive electrodes. In other embodiment, the bonding wires may be electrically conductive connections. The substrate may be submount, carrier or circuit board.

The first bonding pad 114 is disposed on the substrate 112. The second bonding pads 116 are disposed on the substrate 112 and arranged in a 3×2 pad array (showing in FIG. 4). The first bonding pad 114 is located adjacent to the second bonding pads 116 arranged in column 1 of the array. The third bonding pad 118 is disposed on the substrate 112 and located adjacent to the second bonding pads 116 arranged in column 2 of the array. The first LED chips 120 are die-bonded or electrically disposed on the first bonding pad 114 and aligned respectively to the second bonding pads 116 arranged in column 1 of the array. The second LED chips 130 are die-bonded or electrically disposed on the second bonding pads 116, respectively. In one embodiment, the LED chips are respectively disposed on the bonding pads and arranged in a 3×3 chip array as shown in FIG. 2.

Each of the first LED chips 120 die-bonded on the first bonding pad 114 is wire-bonded or electrically connected to the corresponding second bonding pad 116 arranged in column 1 of the pad array through one of the bonding wires 140. Each of the second LED chips 130 die-bonded on the second bonding pads 116 arranged in column 2 of the pad array is wire-bonded or electrically connected to the third bonding pad 118 through one of the bonding wires 140. The second LED chips 130 die-bonded on the second bonding pad 116 arranged in column 1 and row j of the pad array is wire-bonded or electrically connected to the second bonding pad 116 arranged in column 2 and row j of the array through one of the bonding wires 140. It is to be noted that j may be represented as $1 \leq j \leq 3$.

Under the arrangement in LED package 100, even if the first LED chips 120 and second LED chips 140 are vertical type (showing vertical type), the second LED chips 130 arranged in the same row of the chip array and the corresponding first LED chip 120 are able to be connected in series through the bonding wires 140 and bonding pads, such that the driving current for the LED package 100 is lowered. The first LED chips 20 and the second LED chips 30 are electrically connected in series. In addition, the length of the bonding wires 140 is able to be shortened to prevent the bonding wires 140 from being cracked and collapsed and crossing over the first LED chips 20 and the second LED chips 130, such that reliability and optical quality of the LED package 100 is promoted. In one embodiment, the LED package substrate 110 is used for carrying horizontal type LED chips. The horizontal type LED chip includes two electrodes on the same surface thereof.

Particularly, each of the second bonding pads 116 has a die-bonded portion 116a (showing in FIG. 4) for the corresponding second LED chip 130, a wire-bonded portion 116b (showing in FIG. 4) for the corresponding bonding wire 140, and a recess 116c between the die-bonded portion 116a and the wire-bonded portion 116b. By forming the recess 116c between the die-bonded portion 116a and the wire-bonded portion 116b, packaging adhesive for each second LED chip 130 is prevented from overflowing to the corresponding wire-bonded portion 116b, such that each wire-bonded portion 116b is certainly electrically connected to the corresponding bonding wire 140.

The wire-bonded portion 116b of the second bonding pad 116 arranged in column 2 and row 2 of the pad array is located between the die-bonded portion 116a of the second bonding pad 116 arranged in column 2 and row 2 of the pad array and the die-bonded portion 116a of the second bonding pad 116 arranged in column 1 and row 2 of the pad array. The die-bonded portions 116a of the bonding pads 116 arranged in row 1 of the pad array are located between the wire-bonded portions 116b arranged in row 1 of the pad array and the second bonding pads 116 arranged in row 2 of the pad array. The die-bonded portions 116a of the bonding pads 116 arranged in row 3 of the pad array are located between the wire-bonded portions 116b arranged in row 3 of the pad array and the second bonding pads 116 arranged in row 2 of the pad array. Thus, each bonding wire 140 is surely prevented from crossing over the first LED chips 120 and second LED chips 130.

In addition, because the relative positions between the die-bonded portion 116a and the wire-bonded portion 116b of the second bonding pads 116 located in row 1 and row 3 of the pad array are different from that of the second bonding pads 116 located in row 2, each of the wire-bonded portions 116b of the second bonding pads 116 arranged in row 1 and row 3 of the pad array is not located between two LED chips. Each of the wire-bonded portions 116b of the second bonding pads 116 arranged in row 2 of the pad array is located between two LED chips. Thus, the first LED chips 120 and the second LED chips 130 are concentrated at center area of the substrate 112, such that a coating range of fluorescence powder for the LED package 100 is reduced for saving manufacturing cost. In the row 1 of pad array, the wire-bonded portion 116b is located above the die-bonded portion 116a. In the row 3 of pad array, the wire-bonded portion 116b is located under the die-bonded portion 116a. In the row 2 of pad array, the wire-bonded portion 116b is located in the left side of the die-bonded portion 116a. In one embodiment, in the row 2 of pad array, the wire-bonded portion 116b may be located in the right side of the die-bonded portion 116a.

Referring to FIG. 2 and FIG. 3, the LED package 100 further includes a lens 150 covering the first LED chips 120 and the second LED chips 130, and an optical axis of the second LED chip 130 die-bonded on the second bonding pad 116 arranged in column 1 and row 2 of the pad array is aligned to an optical axis of the lens 150. In other words, the optical axis of the centered LED chip arranged in column 2 and row 2 of the chip array is aligned to the optical axis of the lens 150, such that the LED package 100 has appropriate optical quality. In one embodiment, the lens 150 may be an encapsulant by molding process. The Lens 150 may be a material of silicon. In one embodiment, the LED package 100 further includes a phosphor layer 135 disposed between the LED chips and the Lens 135 for covering the first LED chips 120 and the second LED chips 130. The phosphor layer 135 may include a yellow phosphor, a red phosphor, a green phosphor or the any combination thereof.

Figure 5:
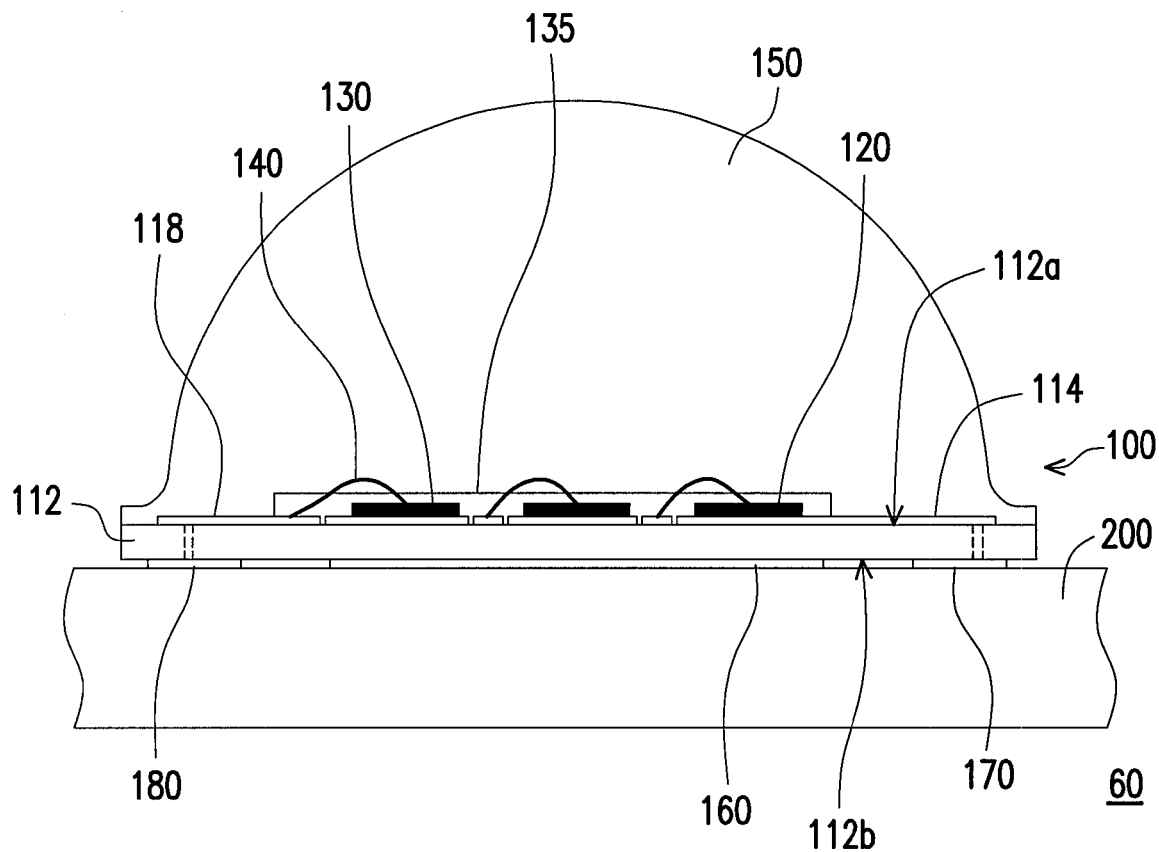
FIG. 5 is a side view of a lighting device having the LED package in FIG. 1.
Figure 6:
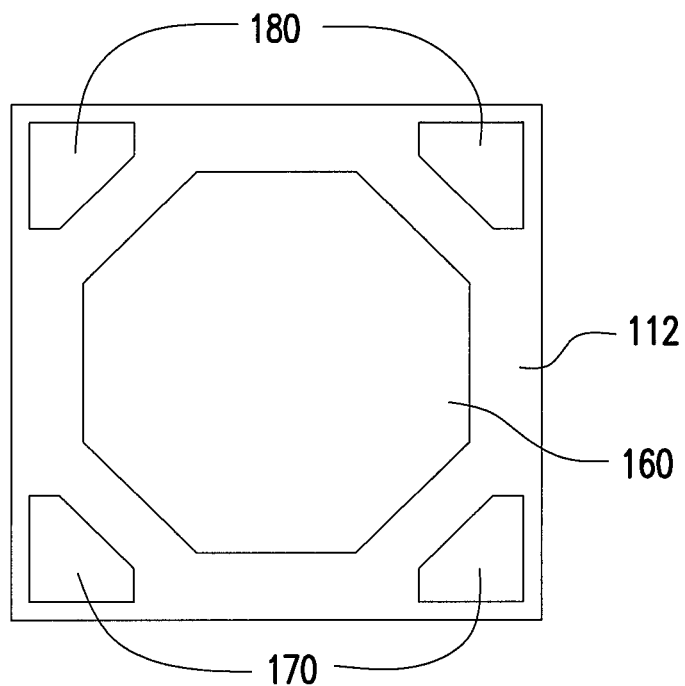
FIG. 6 is a bottom view the LED package in FIG. 1.

FIG. 5 is a side view of the LED package in FIG. 1. FIG. 6 is a bottom view the LED package in FIG. 1. Referring to FIG. 3, FIG. 5 and FIG. 6, the LED package 100 further includes a heat conduction pad 160, at least a first electrode 170 (showing two) and at least a second electrode 180 (showing two). The substrate 112 has a first surface 112a and a second surface 112b opposite to the first surface 112a. In one embodiment, the first surface 112a and the second surface 112b may be a top surface and a bottom surface, respectively. The heat conduction pad 160 is disposed on the second surface 112b. The first electrode 170 is disposed on the second surface 112b and electrically connected to the first bonding pad 114 via internal circuitry, pin through hole or plug of the substrate 112. The second electrode 180 is disposed on the second surface 112b and electrically connected to the third bonding pad 118 via internal circuitry, pin through hole or plug of the substrate 112.

In the embodiment, a material of the substrate 112 is ceramics or other insulating material with high thermal conductivity, such that the heat conduction pad 160 is prevented from being electrically connected to the first electrode 170 and the second electrode 170, and heat dissipation efficiency of the LED package 100 is promoted. By arranging the heat conduction pad 160, first electrode 170 and second electrode 180 mentioned together on the second surface 112b of the substrate 112, size of the LED package 100 is reduced and manufacturing process is facilitated. Method for forming the heat conduction pad 160, first electrode 170 and second electrode 180 is, for example, electroplating, electroless plating, printing or other suitable methods.

Referring to FIG. 5, the LED package 100 is disposed on a base 200 to form a lighting device 60 including the LED package 100 and the base 200. The heat conduction pad 160 contacts the base 60 for conducting heat generated from the LED package 100 to the base 60. For example, the substrate 112 and the heat conduction pad 160 are disposed on the base 60 through surface-mount technology (SMT). In one embodiment, the base 200 may be flexible circuit board or printed circuit board (PCB).

In the embodiment, the first LED chips 120 and the second LED chips 130 includes white light LED chips, blue light LED chips, red light LED chips, green light LED chips, or any combination thereof, such that the lighting device 60 is suitable for emitting white light or colorful light.

Figure 7:
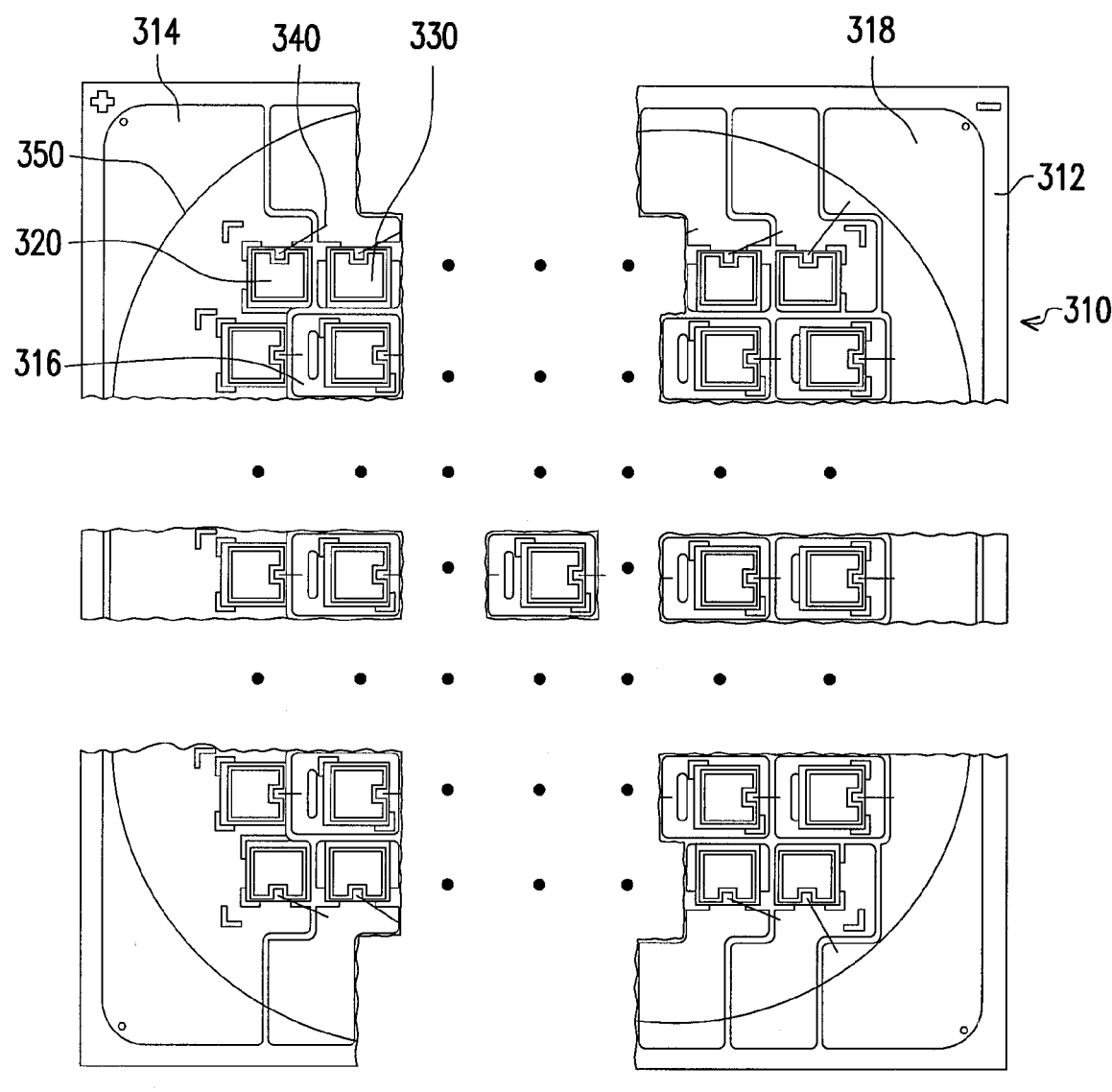
FIG. 7 is a top view of a light emitting diode package according to another embodiment of the present invention.
Figure 8:
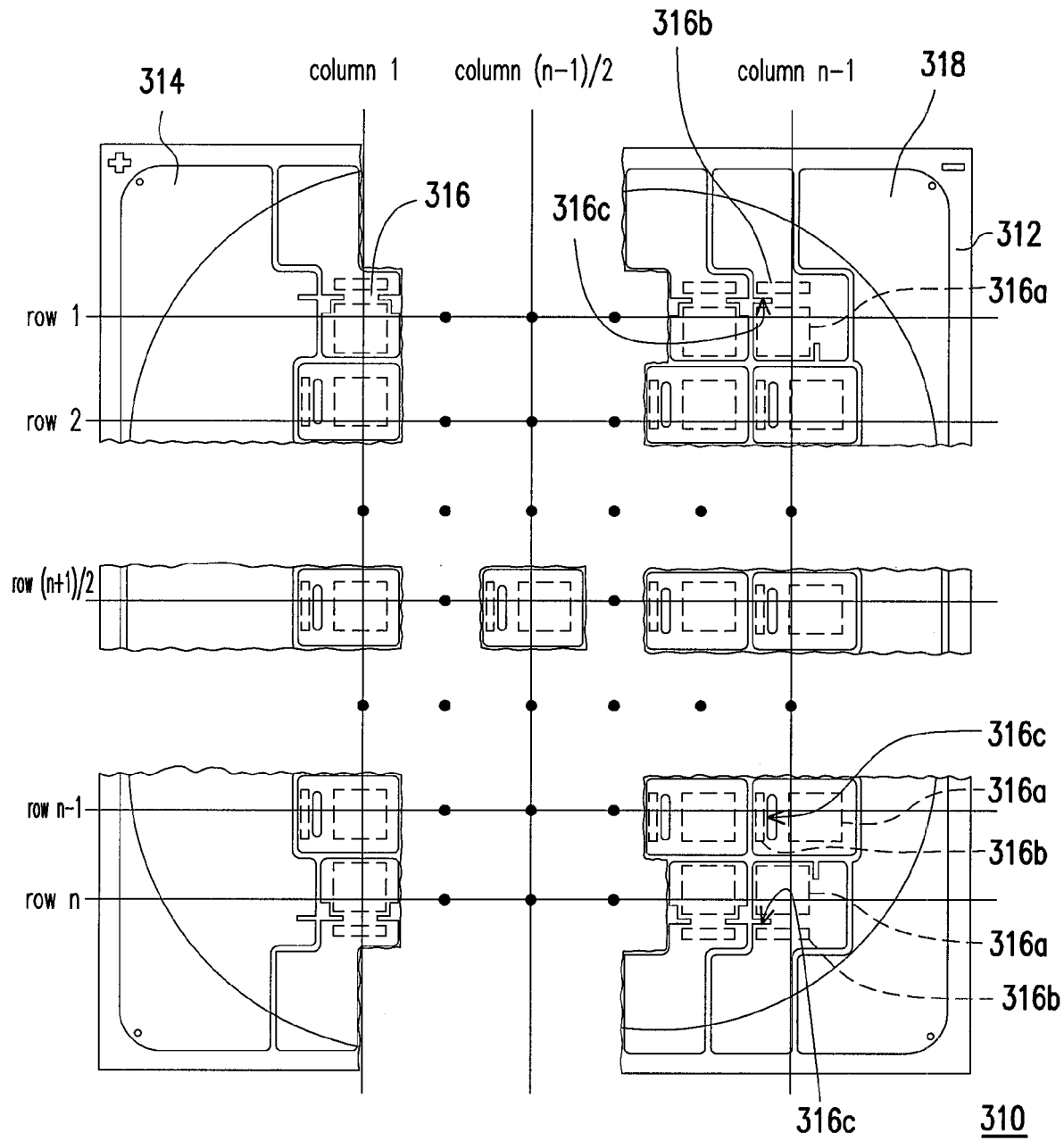
FIG. 8 is a top view of the light emitting diode package substrate of FIG. 7.

The numbers of first LED chips 120 and the second LED chips 130 are not limited in the present invention. FIG. 7 is a top view of a light emitting diode package according to another embodiment of the present invention. FIG. 8 is a top view of the light emitting diode package substrate of FIG. 7. Referring to FIG. 7 to FIG. 8, the light emitting diode (LED) package 300 of the embodiment includes a LED package substrate 310, a plurality of first LED chips 320, a plurality of second LED chips 330 and a plurality of bonding wires 340. The LED package substrate 310 includes a substrate 312, a first bonding pad 314, a plurality of second bonding pads 316 and a third bonding pad 318. In one embodiment, the substrate 312 includes a top surface, and the first bonding pad 314 is disposed on a left side region of the top surface of the substrate 312. The third bonding pad 118 is disposed on a right side region of the top surface of the substrate 312. The second bonding pads 316 are disposed on a middle region of the top surface of the substrate 312. The second bonding pads 316 are disposed between the first bonding pad 314 and the second bonding pad 318. In another embodiment, the bonding pads may be electrically conductive electrodes. In other embodiment, the bonding wires may be electrically conductive connections. The substrate may be submount, carrier or circuit board.

The first bonding pad 314 is disposed on the substrate 312. The second bonding pads 316 are disposed on the substrate 312 and arranged in an n×(n−1) pad array (showing in FIG. 8), wherein n is a positive integer. The first bonding pad 314 is located adjacent to the second bonding pads 316 arranged in column 1 of the pad array. The third bonding pad 318 is disposed on the substrate 312 and located adjacent to the second bonding pads 316 arranged in column n−1 of the pad array. The first LED chips 320 are die-bonded on the first bonding pad 314 and aligned respectively to the second bonding pads 316 arranged in column 1 of the pad array. The second LED chips 330 are die-bonded on the second bonding pads 316, respectively. In one embodiment, the LED chips are respectively disposed on the bonding pads and arranged in a n×n chip array as shown in FIG. 7.

Each of the first LED chips 320 is wire-bonded or electrically connected to the corresponding second bonding pad 316 arranged in column 1 of the pad array through one of the bonding wires 340. Each of the second LED chips 330 die-bonded on the second bonding pads 316 arranged in column n−1 of the pad array is wire-bonded or electrically connected to the third bonding pad 318 through one of the bonding wires 340. The second LED chips 330 die-bonded on the second bonding pad 316 arranged in column i and row j of the pad array is wire-bonded or electrically connected to the second bonding pad 316 arranged in column i+1 and row j of the pad array through one of the bonding wires 340, It is to be noted that i and j may be represented as $1 \leq i \leq n-2$ and $1 \leq j \leq n$.

Under the arrangement in LED package 300, even if the first LED chips 320 and second LED chips 340 are vertical type (showing vertical type), the second LED chips 330 arranged in the same row of the chip array and the corresponding first LED chip 320 are able to be connected in series through the bonding wires 340 and bonding pads, such that the driving current for the LED package 300 is lowered. The first LED chips 320 and the second LED chips 330 are electrically connected in series. In addition, the length of the bonding wires 340 is able to be shortened to prevent the bonding wires 340 from being cracked and collapsed and crossing over the first LED chips 320 and the second LED chips 330, such that reliability and optical quality of the LED package 300 is promoted. In one embodiment, the LED package substrate 310 is used for carrying horizontal type LED chips. The horizontal type LED chip includes two electrodes on the same surface thereof.

Particularly, each of the second bonding pads 316 has a die-bonded portion 316a (showing in FIG. 8) for the corresponding second LED chip 330, a wire-bonded portion 316b (showing in FIG. 8) for the corresponding bonding wire 340, and a recess 316c between the die-bonded portion 316a and the wire-bonded portion 316b. By forming the recess 316c between the die-bonded portion 316a and the wire-bonded portion 316b, packaging adhesive for each second LED chip 330 is prevented from overflowing to the corresponding wire-bonded portion 316b, such that each wire-bonded portion 316b is certainly electrically connected to the corresponding bonding wire 340.

The wire-bonded portion 316b of the second bonding pad 316 arranged in column i+1 and row j of the pad array is located between the die-bonded portion 316a of the second bonding pad 316 arranged in column i+1 and row j of the pad array and the die-bonded portion 316a of the second bonding pad 316 arranged in column i and row j of the pad array, wherein $1 \leq i \leq n-2$ and $1 \leq j \leq n$. The die-bonded portions 316a of the bonding pads 316 arranged in row 1 of the pad array are located between the wire-bonded portions 316b arranged in row 1 of the pad array and the second bonding pads 316 arranged in row 2 of the pad array. The die-bonded portions 316a of the bonding pads 316 arranged in row n of the pad array are located between the wire-bonded portions 316b arranged in row n of the pad array and the second bonding pads 316 arranged in row n−1 of the pad array. Thus, each bonding wire 340 is surely prevented from crossing over the first LED chips 320 and second LED chips 330.

In addition, because the relative positions between the die-bonded portion 316a and the wire-bonded portion 316b of the second bonding pads 316 located in row 1 and row n of the pad array are different from that of the second bonding pads 316 located in row 2 to row n−1, each of the wire-bonded portions 316b of the second bonding pads 316 arranged in row 1 and row n of the pad array is not located between two LED chips. Each of the wire-bonded portions 316b of the second bonding pads 316 arranged in row 2~n−1 of the pad array is located between two LED chips. Thus, the first LED chips 320 and the second LED chips 330 are concentrated at center area of the substrate 312, such that a coating range of fluorescence powder for the LED package 300 is reduced for saving manufacturing cost. In the row 1 of pad array, the wire-bonded portion 316b is located above the die-bonded portion 316a. In the row n of pad array, the wire-bonded portion 316b is located under the die-bonded portion 316a. In the row 2~n−1 of pad array, the wire-bonded portion 316b is located in the left side of the die-bonded portion 316a. In one embodiment, in the row 2 of pad array, the wire-bonded portion 316b may be located in the right side of the die-bonded portion 316a.

Referring to FIG. 7, the LED package 300 further includes a lens 350 covering the first LED chips 320 and the second LED chips 330, and an optical axis of the second LED chip 330 die-bonded on the second bonding pad 316 arranged in column (n−1)/2 and row (n+1)/2 of the pad array is aligned to an optical axis of the lens 350, wherein n is an odd number. In other words, the optical axis of the centered LED chip arranged in column (n+1)/2 and row (n+1)/2 of the chip array is aligned to the optical axis of the lens 350, such that the LED package 300 has appropriate optical quality. In one embodiment, the lens 350 may be an encapsulant by molding process. The lens may be a material of silicon. In one embodiment, the LED package 300 further includes a phosphor layer disposed between the LED chips and the lens for covering the first LED chips 320 and the second LED chips 330. The phosphor layer may include a yellow phosphor, a red phosphor, a green phosphor or the any combination thereof.

The LED package 300 further includes a heat conduction pad, at least a first electrode and at least a second electrode. The substrate 312 has a first surface and a second surface opposite to the first surface. In one embodiment, the first surface and the second surface may be a top surface and a bottom surface, respectively. The heat conduction pad is disposed on the second surface. The first electrode is disposed on the second surface and electrically connected to the first bonding pad 314 via internal circuitry, pin through hole or plug of the substrate 312. The second electrode is disposed on the second surface and electrically connected to the third bonding pad 318 via internal circuitry, pin through hole or plug of the substrate 312.

A material of the substrate 312 is ceramics or other insulating material with high thermal conductivity, such that the heat conduction pad is prevented from being electrically connected to the first electrode and the second electrode, and heat dissipation efficiency of the LED package 300 is promoted. By arranging the heat conduction pad, first electrode and second electrode mentioned together on the second surface of the substrate 312, size of the LED package 300 is reduced and manufacturing process is facilitated. Method for forming the heat conduction pad, first electrode and second electrode is, for example, electroplating, electroless plating, printing or other suitable methods.

The LED package 300 may be disposed on a base to form a lighting device including the LED package and the base. The heat conduction pad contacts the base for conducting heat generated from the LED package 300 to the base. For example, the substrate 312 and the heat conduction pad are disposed on the base through surface-mount technology (SMT). In one embodiment, the base may be flexible circuit board or printed circuit board (PCB).

In the embodiment, the first LED chips 320 and the second LED chips 330 includes white light LED chips, blue light LED chips, red light LED chips, green light LED chips, or any combination thereof, such that the lighting device is suitable for emitting white light or colorful light.

In the LED chips of row 2~(n−1) except column n, left LED chip is wire-bonded to a left wire-bonded portion of small electrode area having a right die-bonded portion on which right adjacent LED chip is mounted. A recess is formed between the left wire-bonded portion and the right die-bounded portion in the small electrode area.

In the LED chips of row 1 except column n, left LED chip is wire-bonded to an upper wire-bonded portion of small electrode area having a lower die-bonded portion on which right adjacent LED chip is mounted. A recess is formed between the upper wire-bonded portion and the lower wire-bonded portion in the small electrode area.

In the LED chips of row n except column n, left LED chip is wire-bonded to a lower wire-bonded portion of small electrode area having an upper die-bonded portion on which right adjacent LED chip is mounted. A recess is formed between the lower wire-bonded portion and the upper die-bonded portion in the small electrode area.

In summary, the LED package of the present invention has a plurality of second bonding pads arranged in an array and located between the first and third bonding pad. Even if the first and second LED chips are vertical type, the second LED chips arranged in the same row of the array and the corresponding first LED chip are able to be connected in series through the bonding wires, such that the driving voltage for the LED package is lowered. In addition, the length of the bonding wires is able to be shortened to prevent the bonding wires from being cracked and collapsed and crossing over the LED chips, such that reliability and optical quality of the LED package is promoting. In addition, by forming the recess between the die-bonded portion and the wire-bonded portion, packaging adhesive for each second LED chip is prevented from overflowing to the corresponding wire-bonded portion, such that each wire-bonded portion is certainly electrically connected to the corresponding bonding wire.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode (LED) package, comprising:
    a LED package substrate, comprising:
        a substrate;
        a first bonding pad, disposed on the substrate;
        a plurality of second bonding pads, disposed on the substrate and arranged in an n×(n−1) array, wherein n is a positive integer, and the first bonding pad is located adjacent to the second bonding pads arranged in column 1 of the array; and
        a third bonding pad, disposed on the substrate and located adjacent to the second bonding pads arranged in column n−1 of the array, wherein the second bonding pads are disposed between the first bonding pad and the third bonding pad;
    a plurality of first LED chips, die-bonded on the first bonding pad and aligned respectively to the second bonding pads arranged in column 1 of the array;
    a plurality of second LED chips, die-bonded on the second bonding pads respectively; and
    a plurality of bonding wires, each of the first LED chips is wire-bonded to the corresponding second bonding pad arranged in column 1 of the array through one of the bonding wires, each of the second LED chips die-bonded on the second bonding pads arranged in column n−1 of the array is wire-bonded to the third bonding pad through one of the bonding wires, and the second LED chip die-bonded on the second bonding pad arranged in column i and row j of the array is wire-bonded to the second bonding pad arranged in column i+1 and row j of the array through one of the bonding wires, wherein $1 \leq i \leq n-2$ and $1 \leq j \leq n$.

2. The LED package of claim 1, wherein each of the second bonding pads arranged in row 2 to row n−1 of the array has a die-bonded portion for the corresponding second LED chip, a wire-bonded portion for the corresponding bonding wire, and a recess between the die-bonded portion and the wire-bonded portion, wherein the wire-bonded portion of the second bonding pad arranged in column i+1 and row j of the array is located between the die-bonded portion of the second bonding pad arranged in column i+1 and row j of the array and the die-bonded portion of the second bonding pad arranged in column i and row j of the array.

3. The LED package of claim 1, wherein each of the second bonding pads arranged in row 1 of the array has a die-bonded portion for the corresponding second LED chip, a wire-bonded portion for the corresponding bonding wire, and a recess between the die-bonded portion and the wire-bonded portion, wherein the die-bonded portions are located between the wire-bonded portions and the second bonding pads arranged in row 2 of the array.

4. The LED package of claim 1, wherein each of the second bonding pads arranged in row n of the array has a die-bonded portion for the corresponding second LED chip, a wire-bonded portion for the corresponding bonding wire, and a recess between the die-bonded portion and the wire-bonded portion, wherein the die-bonded portions are located between the wire-bonded portions and the second bonding pads arranged in row n−1 of the array.

5. The LED package of claim 1, further comprises a lens covering the first LED chips and the second LED chips, wherein n is an odd number, and an optical axis of the second LED chip die-bonded on the second bonding pad arranged in column (n−1)/2 and row (n+1)/2 of the array is aligned to an optical axis of the lens.

6. The LED package of claim 1, further comprising a phosphor layer covering the first LED chips and the second LED chips.

7. The LED package of claim 1, wherein the substrate includes a first surface and a second surface opposite to the first surface, the first bonding pad, the second bonding pads and the third bonding pad are disposed on the first surface of the substrate, wherein the LED package further comprises:
a heat conduction pad, disposed on the second surface;
at least one first electrode, disposed on the second surface and electrically connected to the first bonding pad; and
at least one second electrode, disposed on the second surface and electrically connected to the third bonding pad.

8. The LED package of claim 1, wherein the first LED chips and second LED chips are electrically connected in series.

9. A lighting device, comprising:
a base; and
a LED package, comprising:
a LED package substrate, comprising:
a substrate, disposed on the base;
a first bonding pad, disposed on the substrate;
a plurality of second bonding pads, disposed on the substrate and arranged in an n×(n+1) array, wherein n is a positive integer, and the first bonding pad is located adjacent to the second bonding pads arranged in column 1 of the array; and
a third bonding pad, disposed on the substrate and located adjacent to the second bonding pads arranged in column n−1 of the array, wherein the second bonding pads are disposed between the first bonding pad and the third bonding pad;
a plurality of first LED chips, die-bonded on the first bonding pad and aligned respectively to the second bonding pads arranged in column 1 of the array;
a plurality of second LED chips, die-bonded on the second bonding pads respectively; and
a plurality of bonding wires, each of the first LED chips is wire-bonded to the corresponding second bonding pad arranged in column 1 of the array through one of the bonding wires, each of the second LED chips die-bonded on the second bonding pads arranged in column n−1 of the array is wire-bonded to the third bonding pad through one of the bonding wires, and the second LED chip die-bonded on the second bonding pad arranged in column i and row j of the array is wire-bonded to the second bonding pad arranged in column i+1 and row j of the array through one of the bonding wires, wherein 1≦i≦n−2 and 1≦j≦n.

10. The lighting device of claim 9, wherein each of the second bonding pads arranged in row 2 to row n−1 of the array has a die-bonded portion for the corresponding second LED chip, a wire-bonded portion for the corresponding bonding wire, and a recess between the die-bonded portion and the wire-bonded portion, wherein the wire-bonded portion of the second bonding pad arranged in column i+1 and row j of the array is located between the die-bonded portion of the second bonding pad arranged in column i+1 and row j of the array and the die-bonded portion of the second bonding pad arranged in column i and row j of the array.

11. The lighting device of claim 9, wherein each of the second bonding pads arranged in row 1 of the array has a die-bonded portion for the corresponding second LED chip, a wire-bonded portion for the corresponding bonding wire, and a recess between the die-bonded portion and the wire-bonded portion, wherein the die-bonded portions are located between the wire-bonded portions and the second bonding pads arranged in row 2 of the array.

12. The lighting device of claim 9, wherein each of the second bonding pads arranged in row n of the array has a die-bonded portion for the corresponding second LED chip, a wire-bonded portion for the corresponding bonding wire, and a recess between the die-bonded portion and the wire-bonded portion, wherein the die-bonded portions are located between the wire-bonded portions and the second bonding pads arranged in row n−1 of the array.

13. The lighting device of claim 9, wherein the LED package further comprises a lens covering the first LED chips and the second LED chips, n is an odd number, and an optical axis of the second LED chip die-bonded on the second bonding pad arranged in column (n−1)/2 and row (n+1)/2 of the array is aligned to an optical axis of the lens.

14. The lighting device of claim 9, wherein the LED package further comprises a phosphor layer covering the first LED chips and the second LED chips.

15. The lighting device of claim 9, wherein the substrate includes a first surface and a second surface opposite to the first surface, the first bonding pad, the second bonding pads and the third bonding pad are disposed on the first surface of the substrate, wherein the LED package further comprising:
a heat conduction pad, disposed on the second surface and contacting the base;
a first electrode, disposed on the second surface and electrically connected to the first bonding pad; and
a second electrode, disposed on the second surface and electrically connected to the third bonding pad.

16. The lighting device of claim 9, wherein the first LED chips and the second LED chips are electrically connected in series.

17. A LED package substrate, comprising:
a substrate;
a first bonding pad, disposed on the substrate;
a plurality of second bonding pads, disposed on the substrate and arranged in an n ×(n−1) array, wherein n is a positive integer, and the first bonding pad is located adjacent to the second bonding pads arranged in column 1 of the array; and
a third bonding pad, disposed on the substrate and located adjacent to the second bonding pads arranged in column n−1 of the array, wherein the second bonding pads are disposed between the first bonding pad and the third bonding pad, wherein each of the second bonding pads arranged in row 2 to row n−1 of the array has a die-bonded portion, a wire-bonded portion, and a recess between the die-bonded portion and the wire-bonded portion, wherein the wire-bonded portion of the second bonding pad arranged in column i+1 and row j of the array is located between the die-bonded portion of the second bonding pad arranged in column i+1 and row j of the array and the die-bonded portion of the second bonding pad arranged in column i and row j of the array.

18. The LED package substrate of claim 17, wherein each of the second bonding pads arranged in row 1 of the array has a die-bonded portion, a wire-bonded portion, and a recess between the die-bonded portion and the wire-bonded portion, wherein the die-bonded portions are located between the wire-bonded portions and the second bonding pads arranged in row 2 of the array.

19. The LED package substrate of claim 17, wherein each of the second bonding pads arranged in row n of the array has a die-bonded portion, a wire-bonded portion, and a recess between the die-bonded portion and the wire-bonded portion, wherein the die-bonded portions are located between the wire-bonded portions and the second bonding pads arranged in row n−1 of the array.

* * * * *